US007795716B2

United States Patent
Burger et al.

(10) Patent No.: US 7,795,716 B2
(45) Date of Patent: Sep. 14, 2010

(54) RF TRANSISTOR OUTPUT IMPEDANCE TECHNIQUE FOR IMPROVED EFFICIENCY, OUTPUT POWER, AND BANDWIDTH

(75) Inventors: Jeffrey A. Burger, Rolling Hills Estates, CA (US); Fouad F. Boueri, Santa Monica, CA (US)

(73) Assignee: Integra Technologies, Inc., El Segundo, CA (US)

( * ) Notice: Subject to any disclaimer, the term of this patent is extended or adjusted under 35 U.S.C. 154(b) by 29 days.

(21) Appl. No.: 12/053,277

(22) Filed: Mar. 21, 2008

(65) Prior Publication Data

US 2009/0236737 A1    Sep. 24, 2009

(51) Int. Cl.
*H01L 23/02* (2006.01)

(52) U.S. Cl. ............... 257/685; 257/577; 257/728; 257/E21.614

(58) Field of Classification Search .......... 257/577, 257/685, 723, 784, 786, E25.006, E25.013, 257/E25.018, E25.021, E25.027, E21.614, 257/E23.085, 300, 526, 575, 758, 728, E23.024

See application file for complete search history.

(56) References Cited

U.S. PATENT DOCUMENTS 6,329,675 B2 *  12/2001  Singh et al. ............... 257/77

* cited by examiner

*Primary Examiner*—Davienne Monbleau
*Assistant Examiner*—Dilinh P Nguyen
(74) *Attorney, Agent, or Firm*—Fountain Law Group Inc.; George L. Fountain

(57) ABSTRACT

An RF/microwave circuit is configured to eliminate the physical constraint that requires a sacrifice of one output series inductor wirebond for each shunt inductor wirebond. The circuit employs a multi-level metalized substrate as part of its output impedance matching network. The lower level of the multi-level substrate serves as an intermediate connection point for the output series inductor wirebonds as it extends from the output terminal of an active device to an output metallization pad. The upper level of the multi-level substrate serves to support a DC block capacitor and as an intermediate connection point for the shunt inductor wirebonds. The multi-level substrate allows the series inductor wirebonds to be positioned at a lower height, and the shunt inductor wirebonds at a greater height. Because they are at different heights, the physical constraint of sacrificing a series wirebond per a shunt inductor wirebond can be eliminated. This leads to improved power efficiency, higher gain, and greater bandwidth.

4 Claims, 5 Drawing Sheets

US 7,795,716 B2

RF TRANSISTOR OUTPUT IMPEDANCE TECHNIQUE FOR IMPROVED EFFICIENCY, OUTPUT POWER, AND BANDWIDTH

FIELD OF THE INVENTION

This invention relates generally to radio frequency (RF) and microwave circuits, and in particular, to an RF/microwave output impedance technique for improved efficiency, output power, and bandwidth.

BACKGROUND OF THE INVENTION

High power RF and microwave devices are generally implemented as hybrid devices. These hybrid devices typically include one or more transistor chips, one or more capacitor chips, and one or more inductors that are housed in a package. The one or more capacitor chips are typically realized using silicon metal oxide semiconductor (MOS), silicon metal insulator metal (MIM), or ceramic MIM components. The one or more inductors are typically realized using wirebonds.

These hybrid devices typically incorporate one or more input matching sections coupled to the input of one or more transistors, and one or more output matching sections coupled to the output of the one or more transistors. Usually, the first output matching section (e.g., the section directly coupled or closest to the transistor) is typically situated within the hybrid package due to the relatively low impedance created by the paralleling of many power transistor cells.

Generally, the output modeling of these high power devices typically include a resistor in parallel with a capacitor. In the past, the first output matching section typically consists of a shunt inductor adapted to resonate with the output capacitance of the active device at or near the operating frequency. This is better illustrated and explained with reference to the following example.

FIG. 1A illustrates a schematic diagram of a conventional high power RF/microwave circuit 100. In this example, the high power RF/microwave circuit 100 includes a bipolar junction transistor (BJT) as the active power device of the high power RF/microwave circuit 100. The high power RF/microwave circuit 100 also includes an input matching network having a first input series inductor LIN1, an input shunt capacitor CIN, a second input series inductor LIN2, and an input base inductor LBIN. The high power RF/microwave circuit 100 further includes an output matching network having an output series inductor LC1, a shunt inductor LSH1, a DC block capacitor CDC, and an output base inductor LBOUT. It is the shunt inductor LSH1 that is configured to resonate with the output capacitance of the BJT at or near the operating frequency of the high power RF/microwave circuit 100.

FIGS. 1B-1C illustrate top and side views of an actual implementation of the conventional high power RF/microwave circuit 100. As seen, the inductors are realized as wirebonds. For instance, the first input series inductor LIN1 is realized as a first set of parallel wirebonds connected at one end to an input metallization pad and at another end to a bridge, and a second set of parallel wirebonds connected at one end to the bridge and at another end to the non-ground terminal of the input capacitor CIN. The second input series inductor LIN2 is realized as another set of parallel wirebonds connected at one end to the non-grounded terminal of capacitor CIN and to the emitter of the BJT. The input base inductor LBIN is realized as a set of parallel wirebonds connected at one end to the grounded terminal of the input capacitor CIN and to the base of the BJT. The capacitor CIN and the bridge are disposed on a grounded metallization pad formed on a dielectric substrate MS1. As previously discussed, the inductors LIN1, LIN2, and LBIN, and capacitor CIN form at least part of the input matching network of the high power RF/microwave circuit 100.

With regard to the output matching network of the high power RF/microwave circuit 100, the output base inductor LBOUT is realized as a set of parallel wirebonds connected at one end to the base of the BJT and to the grounded terminal of the DC block capacitor CDC. The output series inductor LC1 is realized as a set of parallel wirebonds connected at one end to a "collector" metallization pad that is electrically connected to the collector of the BJT and at another end to an output metallization pad. The shunt inductor is realized as a set of parallel wirebonds connected at one end to the "collector" metallization pad and to the non-grounded terminal of the DC block capacitor CDC. The DC block capacitor CDC is disposed on a grounded metallization pad, which is formed on the dielectric substrate MS1.

As seen best in FIG. 1B, because both the shunt inductor wirebond LSH1 and the output series inductor wirebond LC1 are connected at one end to the "collector" metallization pad and both extend parallel towards the output metallization pad at similar heights, a shunt inductor wirebond LSH1 occupies the space that would otherwise be occupied by a series inductor wirebond LC1. Thus, this puts a limit on the number of shunt inductor wirebonds that can be provided, and also requires a sacrifice of a series inductor wirebond for each added shunt inductor wirebond. This has adverse consequences on the performance of the conventional high power RF/microwave circuit 100.

For instance, the less number of output series inductor wirebonds causes the series inductance and resistance to be higher. This has the adverse effect of lowering the operating bandwidth of the high power RF/microwave circuit 100 due to the higher output series inductance, since the bandwidth is inversely proportional to the square-root of the output series inductance. This also has the adverse effect of more power losses at the output due to the higher output series resistance, which reduces the power efficiency and gain of the high power RF/microwave circuit 100.

Additionally, the less number of shunt inductor wirebonds produces a higher resistance to ground. This additionally produces more power losses at the output, which results in lower power efficiency and gain. Further, as illustrated in FIG. 1B, because a relatively small number of shunt inductor wirebonds are provided for numerous fingers of the BJT (e.g., 2 wirebonds per 200 fingers), the load distribution across the BJT varies substantially. This results in elevated temperatures at regions where there is an absence of a wirebond. This results in a lower life for the BJT. In addition, the uneven load distribution also reduces the load mismatch tolerance (LMT) because of high VSWR peaks at regions where there is an absence of a wirebond.

SUMMARY OF THE INVENTION

An aspect of the invention relates to an RF/microwave circuit configured to eliminate the physical constraint that requires a sacrifice of one output series inductor wirebond for each added shunt inductor wirebond. The circuit employs a multi-level metalized substrate as part of its output matching network. The lower level of the multi-level substrate serves as an intermediate connection point for the output series inductor wirebonds as it extends from an output terminal of an active device to an output metallization pad. The upper level of the multi-level substrate serves to support a DC block capacitor and as an intermediate connection point for shunt inductor wirebonds. The multi-level substrate allows the series inductor wirebonds to be positioned at a lower height, and the shunt inductor wirebonds at a greater height. Because they are at different heights, the physical constraint of sacrificing a series wirebond per a shunt inductor wirebond can be eliminated. This leads to improved power efficiency, higher gain, and greater bandwidth.

In a more specific embodiment, the RF/microwave circuit comprises an input matching network, an active device, and an output matching network. The active device may be a bipolar junction transistor (BJT), field effect transistor (FET), high electron mobility transistor (HEMT), or other types of active devices.

The input matching network may be configured in numerous manners depending on the specification requirements for the RF/microwave circuit. As an example, the input matching network may comprise an input metallization pad and a grounded metallization pad, both disposed on a dielectric substrate. An input chip capacitor may be disposed on the grounded metallization pad, and includes a non-grounded terminal and a grounded terminal. First input series inductor wirebonds electrically connect the input metallization pad to the non-grounded terminal of the input chip capacitor. Second input series inductor wirebonds electrically connect the non-grounded terminal of the input chip capacitor to a terminal of the active device, such as the emitter terminal of a BJT or the drain or source terminal of a FET or HEMT. Another set of wirebonds may electrically connect a common terminal of the active device, such as the base or gate of a transistor, to ground by attaching to the grounded terminal of the input chip capacitor.

The output matching network may comprise a "device" metallization pad disposed on the dielectric substrate, and electrically connected to an output terminal of the active device, such as the collector of a BJT or the drain or source of a FET or HEMT. The active device may be disposed on the "device" metallization layer, whereby the underside of the device serves as its output terminal. The output matching network may further comprise grounded and output metallization pads disposed on the dielectric substrate. A multi-level substrate including a first-level metallization layer and a second-level metallization layer may be disposed on the grounded metallization pad. A DC block chip capacitor may be disposed on the second-level metallization layer of the multi-level substrate.

First output series inductor wirebonds may electrically connect the "device" metallization pad to the first-level metallization layer of the multi-level substrate. Second output series inductor wirebonds may electrically connect the first-metallization layer of the multi-level substrate to the output metallization pad. Because the first and second series inductor wirebonds connect to a first- or lower-level metallization layer of the multi-level substrate, the height of the wirebonds may be kept relatively low.

First shunt inductor wirebonds may electrically connect the "device" metallization layer to a first terminal of the DC block chip capacitor. Second shunt inductor wirebonds may electrically connect a second terminal of the DC block chip capacitor to the grounded metallization pad. Because the first and second shunt inductor wirebonds connect to a second- or upper-level metallization layer, the height of the wirebonds may be kept relatively high. The height difference between the series and shunt inductor wirebonds avoids the physical constraint of sacrificing a series inductor per the inclusion of a shunt inductor.

The output matching network may further include an output "common terminal" (e.g., base or gate) inductor including a set of wirebonds electrically connecting the common terminal of the active device to the grounded metallization layer.

Other aspects, advantages and novel features of the present invention will become apparent from the following detailed description of the invention when considered in conjunction with the accompanying drawings.

DETAILED DESCRIPTION OF THE EXEMPLARY EMBODIMENTS

Figure 1A:
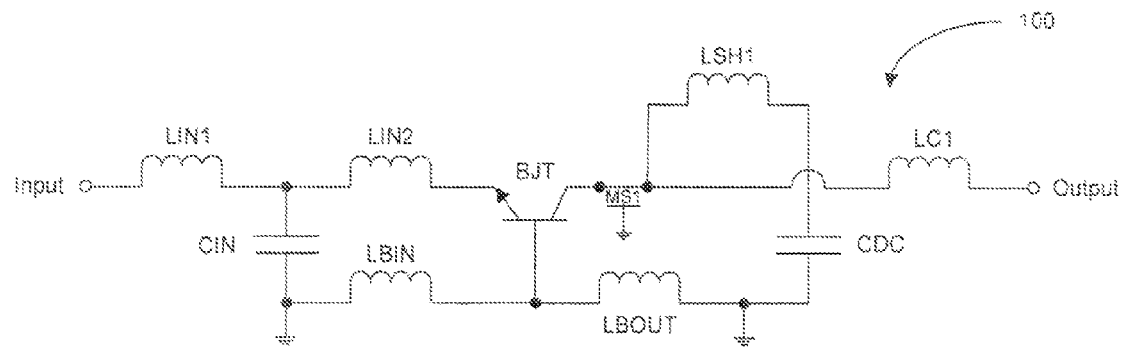
FIG. 1A illustrates a schematic diagram of a conventional high power RF/microwave circuit.
Figure 1B:
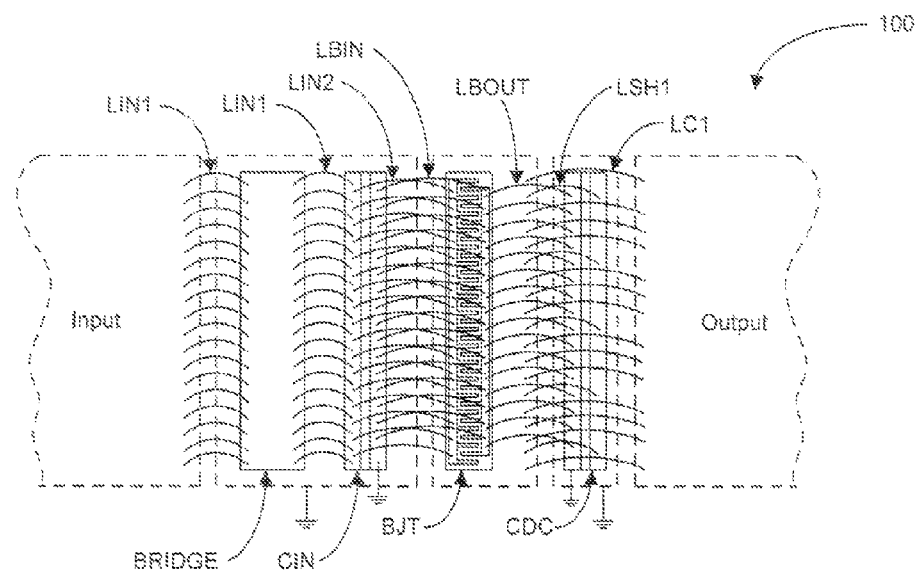
FIGS. 1B-1C illustrate top and side views of an implementation of the conventional high power RF/microwave circuit.
Figure 1C:
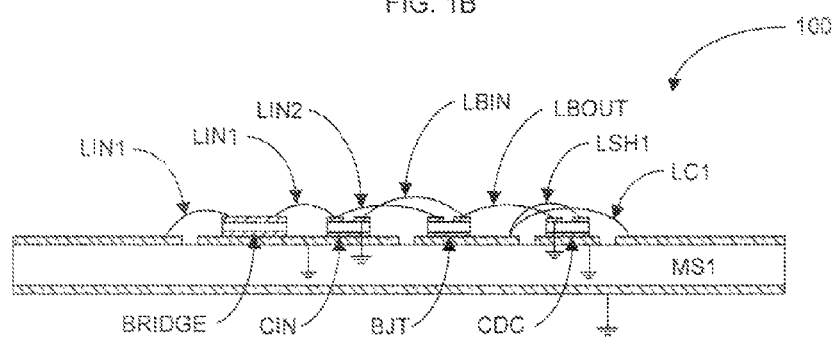
Figure 2A:
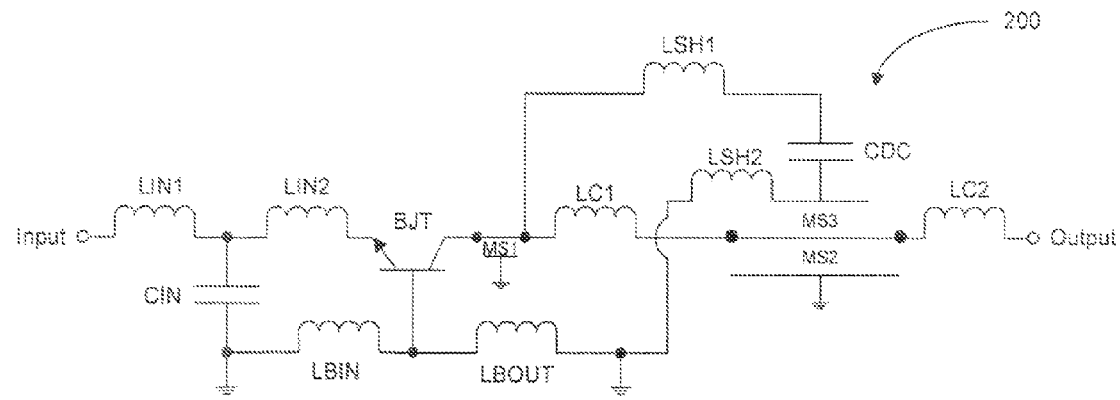
FIG. 2A illustrates a schematic diagram of an exemplary RF/microwave circuit in accordance with an embodiment of the invention.

FIG. 2A illustrates a schematic diagram of an exemplary RF/microwave circuit 200 in accordance with an embodiment of the invention. In summary, the output of the RF/microwave circuit 200 is configured to eliminate the physical constraint that requires a sacrifice of one output series inductor wirebond for each added shunt inductor wirebond. In addition, this configuration allows for more shunt inductor wirebonds and more output series inductor wirebonds. This leads to improved power efficiency, higher gain, and greater bandwidth, among other benefits. This configuration and corresponding benefits are accomplished by providing a multi-level metalized substrate at the output of the RF/microwave circuit 200.

As discussed in more detail below, the lower level of the multi-level substrate serves as an intermediate connection point for output series inductor wirebonds as they extend from an output terminal of an active device to an output metallization pad. The upper level of the multi-level substrate serves to support the DC block capacitor and as an intermediate connection point for shunt inductor wirebonds. The multi-level substrate allows the series inductor wirebonds to be positioned at one particular height, and the shunt inductor wirebonds at another height. Because they are at different heights, the physical constraint of requiring the sacrifice of one series inductor wirebond per the inclusion of one shunt inductor wirebonds is eliminated.

More specifically, the RF/microwave circuit 200 comprises an active device, such as a bipolar junction transistor (BJT). Although a BJT is used to exemplify the concepts of the invention, it shall be understood that other active devices may be used in place thereof. For example, such other active devices include metal oxide semiconductor field effect transistors (MOSFET), double-diffused MOS (DMOS), lateral DMOS (LDMOS), gallium-nitride (GaN) base FETs, high electronic mobility transistors (HEMT), as some examples.

The RF/microwave circuit 200 includes an input impedance matching network coupled to the BJT. In particular, the input impedance matching network comprises a first input inductor LIN1, a second input inductor LIN2, an input capacitor CIN, and an input base inductor LBIN. The first input inductor LIN1 includes an end electrically coupled to an input terminal to receive an input RF/microwave signal, and another end electrically coupled to the non-grounded terminal of the input capacitor CIN. The second input inductor LIN2 includes an end electrically coupled to the non-grounded terminal of the input capacitor CIN, and another end electrically coupled to the emitter of the BJT. The input base inductor LBIN includes an end electrically coupled to the base of the BJT and another end electrically coupled to a ground terminal, which is connected to the grounded terminal of the input capacitor CIN. It shall be understood that the input impedance matching network may be configured in other manners.

The RF/microwave circuit 200 includes an output impedance matching network coupled to the BJT. In particular, the output impedance matching network comprises a first output series inductor LC1, a second output series inductor LC2, a first shunt inductor LSH1, a second shunt inductor LSH2, an output base inductor LBOUT, a DC block capacitor CDC, and a multi-level substrate (MS2/MS3). The first output series inductor LC1 includes an end electrically coupled to the collector of the BJT, and another end electrically coupled to a first-level metallization layer of the multi-level substrate (MS2/MS3). The second output series inductor LC2 includes an end electrically coupled to the first-level metallization layer of the multi-level substrate (MS2/MS3), and another end electrically coupled to an output metallization pad, where an output RF/microwave signal is produced.

The first shunt inductor LSH1 includes an end electrically coupled to the collector of the BJT and a second end electrically coupled to a first terminal of the DC block capacitor CDC. The DC block capacitor CDC, in turn, includes a second terminal electrically coupled to the second-level metallization layer of the multi-level substrate (MS2/MS3). The second shunt inductor LSH2 includes an end electrically coupled to the second terminal of the DC block capacitor CDC, and another end electrically coupled to ground. The output base inductor LBOUT includes an end electrically coupled to the base of the BJT, and another end electrically coupled to ground. It shall be understood that the output impedance matching network may be configured in other manners. As previously discussed, the multi-level substrate eliminates the physical constraint of requiring a sacrifice of a series inductor wirebond per an added shunt inductor wirebond, as discussed in more detail below.

Figure 2B:
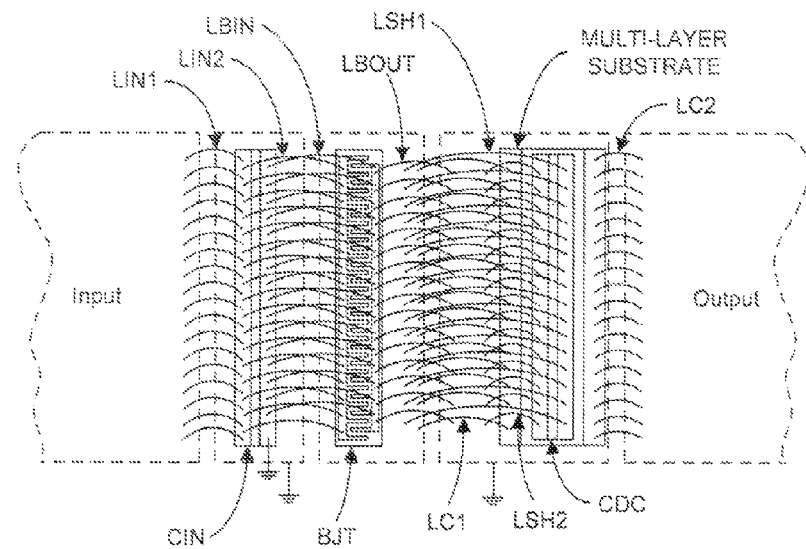
FIGS. 2B-2C illustrate top and side views of one exemplary implementation of the exemplary RF/microwave circuit of FIG. 2A in accordance with another embodiment of the invention.
Figure 2C:
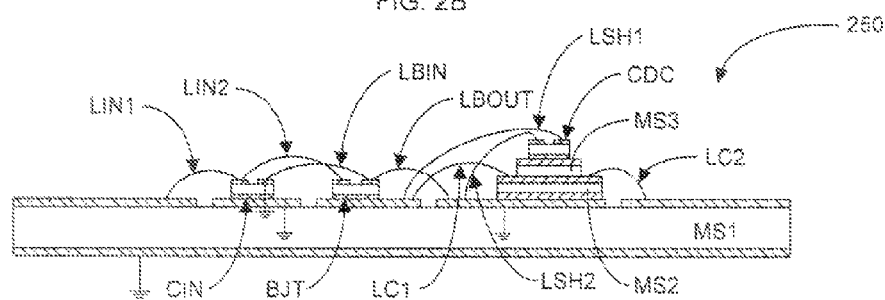

FIGS. 2B-2C illustrate top and side views of one exemplary implementation 250 of the exemplary RF/microwave circuit 200 in accordance with another embodiment of the invention. The RF/microwave circuit 250 comprises an input metallization pad formed on a dielectric substrate MS1. The RF/microwave circuit 250 further comprises an input chip capacitor CIN disposed on a grounded metallization pad which, in turn, is formed on the dielectric substrate MS1. The input chip capacitor CIN includes a non-grounded terminal (e.g., the left terminal in the diagram) and a grounded terminal (e.g., the right-terminal in the diagram). The first input inductor LIN1 is configured as a plurality of parallel wirebonds each having a first end electrically coupled to the input metallization pad, and a second end electrically coupled to the non-grounded terminal of the input chip capacitor CIN.

The RF/microwave circuit 250 further comprises a bipolar junction transistor (BJT) formed on a "collector" metallization pad which, in turn, is formed on the dielectric substrate MS1. The BJT includes an emitter terminal (e.g., the left terminal in the diagram), a base terminal (e.g., the right terminal in the diagram), and a collector terminal which forms the metallization base of the BJT. The collector terminal makes electrical contact to the "collector" metallization pad (ergo, the name for the pad). The second input inductor LIN2 is configured as a plurality of parallel wirebonds each having a first end electrically coupled to the non-grounded terminal of the input chip capacitor CIN, and a second end electrically coupled to the emitter terminal of the BJT. The input base inductor LBIN is also configured as a plurality of parallel wirebonds each having a first end electrically coupled to the grounded terminal of the input chip capacitor, and a second end electrically coupled to the base terminal of the BJT.

The RF/microwave circuit 250 further comprises a grounded metallization pad formed on the dielectric substrate MS1. The output base inductor LBOUT is configured as a plurality of parallel wirebonds each having a first end electrically coupled to the base of the BJT, and a second end electrically coupled to the grounded metallization pad on the dielectric substrate MS1. The first output series inductor LC1 is configured as a plurality of parallel wirebonds each having a first end electrically coupled to the "collector" metallization pad, and a second end electrically connected to the first-level metallization layer of the multi-layer substrate (MS2/MS3).

The RF/microwave circuit 250 further comprises an output metallization layer formed on the dielectric substrate MS1. The second output series inductor LC2 is configured as a plurality of wirebonds each having a first end electrically coupled to the first-level metallization layer of the multi-layer substrate (MS2/MS3), and a second end electrically coupled to the output metallization layer. The RF/microwave circuit 250 further comprises a DC block chip capacitor CDC disposed on the second-level metallization layer of the multi-layer substrate (MS2/MS3). The DC block chip capacitor CDC includes a first terminal (e.g., the left-terminal in the diagram) which is electrically coupled to the second-level metallization layer of the multi-layer substrate (MS2/MS3), and a second terminal (e.g., the right-terminal in the diagram).

The first shunt inductor LSH1 is configured as a plurality of parallel wirebonds each having a first end electrically coupled to the "collector" metallization pad, and a second end electrically coupled to the second terminal of the DC block chip capacitor CDC. The second shunt inductor LSH2 is configured as a plurality of parallel wirebonds each having a first end electrically coupled to the first terminal of the DC block capacitor CDC, and a second end electrically coupled to the grounded metallization pad on the dielectric substrate MS1.

As better illustrated in FIG. 2C, the first series shunt inductor wirebonds LC1 extends from the "collector" metallization pad to the first-level metallization layer of the multi-layer substrate (MS2/MS3) at a lower height than the height in which the first shunt inductor wirebonds LSH1 extends from the "collector" metallization pad to the second terminal of the DC block capacitor CDC. Because of the difference in heights, the physical constraint of requiring a sacrifice of an output series inductor wirebond for each added shunt inductor wirebond is eliminated. This allows for more series and shunt inductor wirebonds, which has substantial benefits in terms of performance, as discussed in more detail below.

First, the more series inductor wirebonds, the lower is the series inductance and the series resistance. The lower series inductance allows the RF/microwave circuit 250 to achieve higher bandwidth, as compared to that of the conventional RF/microwave circuit 100. The lower series resistance allows the RF/microwave circuit 250 to achieve better power efficiency and potentially higher gains, as compared to that of the conventional RF/microwave circuit 100. Second, the more shunt inductor wirebonds, the lower is the shunt resistance. This allows the RF/microwave circuit 250 to achieve better power efficiency and potentially higher gains, as compared to that of the conventional RF/microwave circuit 100. Other advantageous are explained with reference to the following examples.

Figure 3:
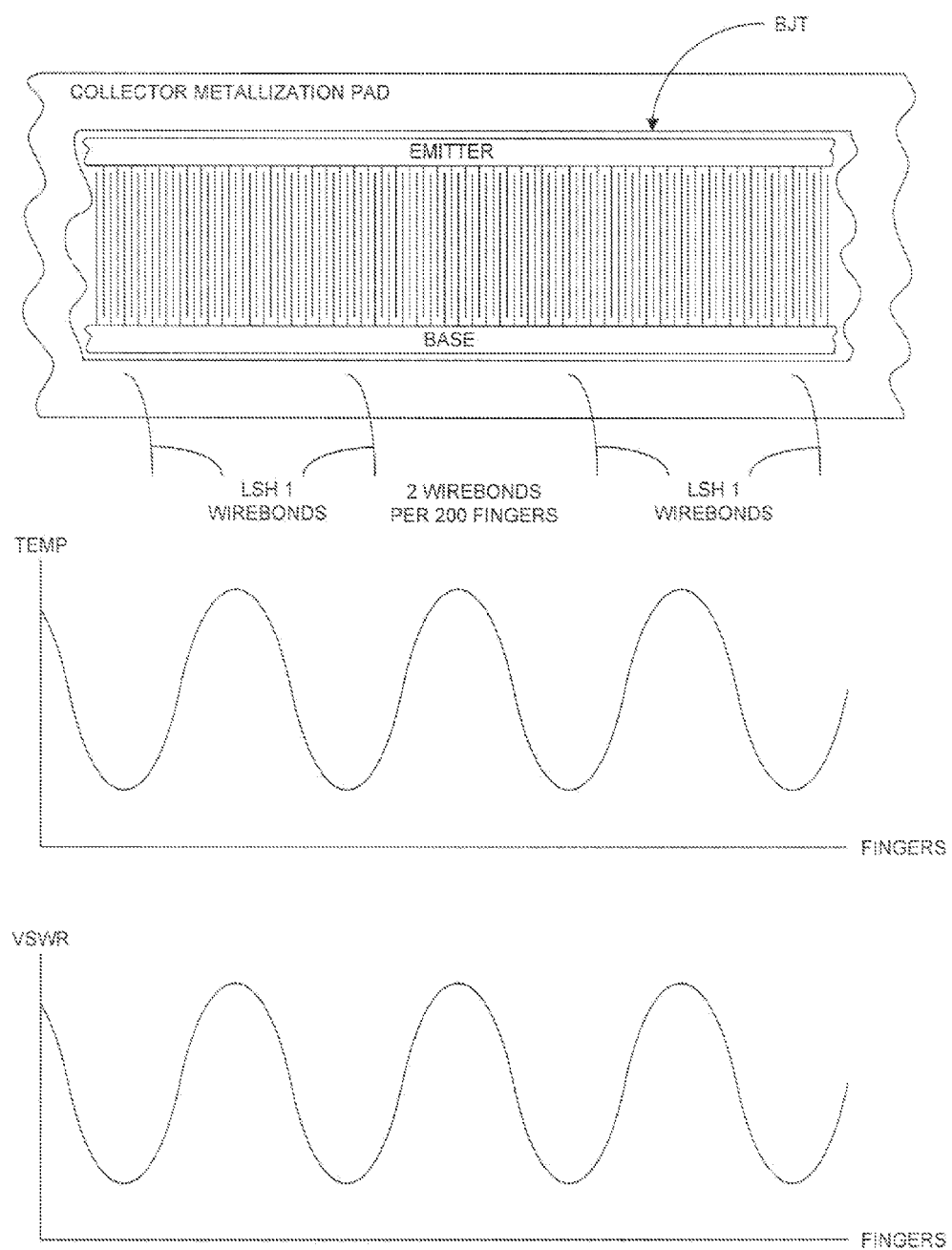
FIG. 3 illustrates a top view of a BJT portion of the conventional RF/microwave circuit, the corresponding temperature distribution across the BJT, and the load or VSWR distribution across the BJT.

FIG. 3 illustrates a top view of a BJT portion of the conventional RF/microwave 100 previously discussed, the corresponding temperature distribution across the BJT, and the load or VSWR distribution across the BJT. As previously discussed, because of the physical constraints of sacrificing a series inductor wirebond for each inclusion of a shunt inductor wirebond, the number of shunt wirebonds coupled to the collector of the BJT is relatively small. For example, the conventional high power RF/microwave 100 may use only 2 wirebonds for every 200 fingers of the BJT.

The relatively small number of wirebonds per relatively large number of fingers results in non-uniform temperature and load distributions across the BJT. For example the second graph illustrates the swing in the temperature across the BJT. It is noted that in the areas near wirebond attachments, the temperature in drops down to a minimum because of the heat sink property of the wirebonds. However, in the area far away from wirebond attachments, such as the middle region between adjacent wirebonds, the temperature increases and maximizes because of the lack of the heat sink mechanism. This creates large swings in temperature across the BJT, and relatively high peak temperatures at various regions of the BJT. This has the adverse effect of reducing the life of the BJT.

Additionally, because of the relatively small number of wirebonds per large number of fingers of the BJT, the load or VSWR distribution across the BJT varies substantially. For example, the second graph illustrates the swing in the VSWR across the BJT. For instance, at or near a region where there is a shunt inductor wirebond connection, the impedance seen by that region of the BJT is relatively small. On the other hand, at or near a region where there is an absence of a wirebond connection, such as the middle region between adjacent wirebonds, the impedance seen by that region of the BJT is relatively large. This produces large VSWR swings across the BJT, and relatively large VSWR peaks at various regions of the BJT. This has an adverse effect on the load mismatch tolerance (LMT) of the conventional high power RF/microwave circuit 100.

Figure 4:
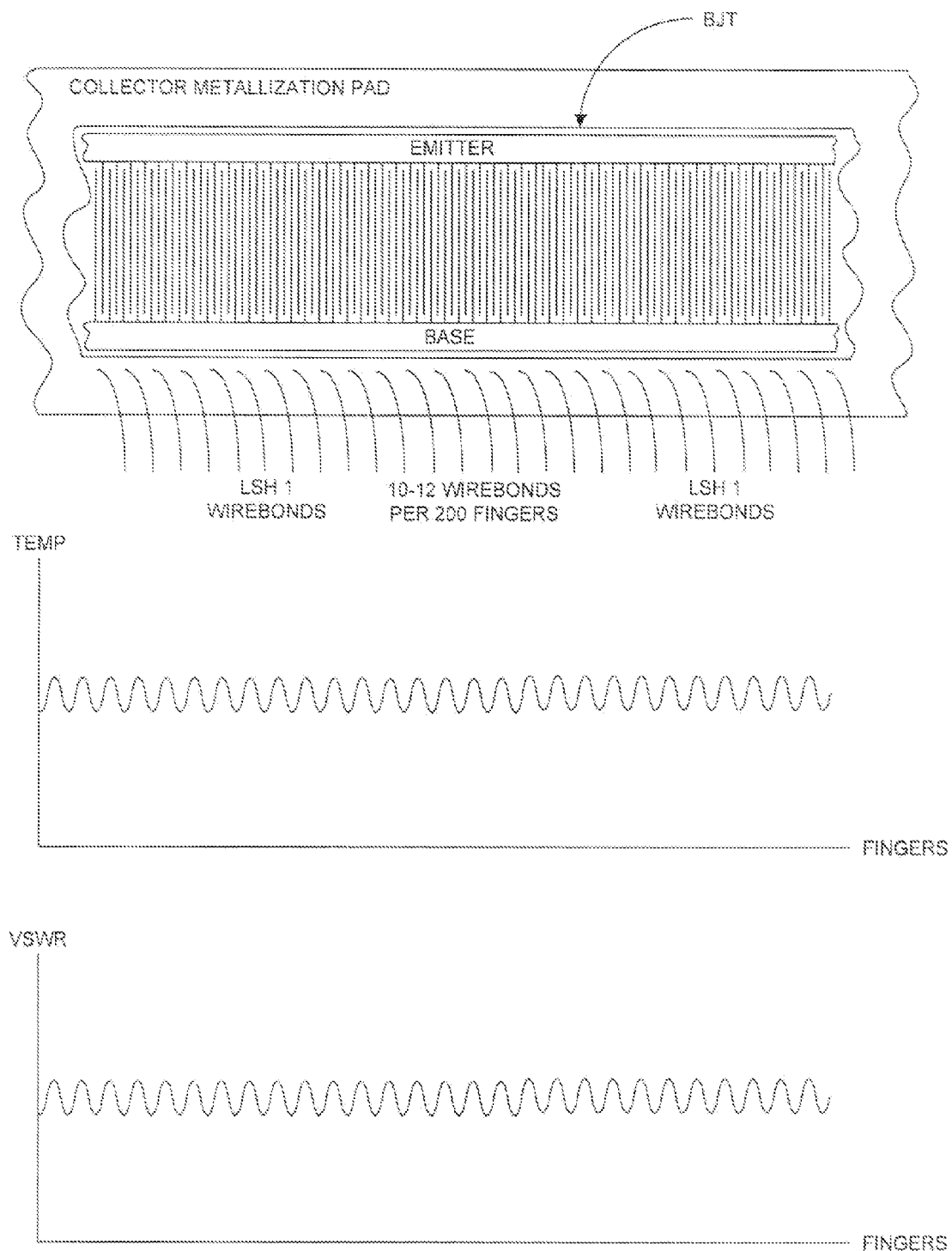
FIG. 4 illustrates a top view of a BJT portion of the exemplary RF/microwave circuit in accordance with another embodiment of the invention, the corresponding temperature distribution across the BJT, and the load or VSWR distribution across the BJT.

FIG. 4 illustrates a top view of a BJT portion of the RF/microwave circuit 250 in accordance with an embodiment of the invention as previously discussed, the corresponding temperature distribution across the BJT, and the load or VSWR distribution across the BJT. As previously discussed, because the RF/microwave circuit 250 does not have the physical constraint of requiring a sacrifice of a series inductor wirebond for each inclusion of a shunt inductor wirebond, the number of shunt wirebonds coupled to the collector of the BJT could be relatively large. For example, the power RF/microwave circuit 250 may use 10-12 wirebonds for every 200 fingers of the BJT.

The relatively large number of wirebonds results in a substantially more uniform temperature and load distributions across the BJT. For example, the first graph illustrates the swing in the temperature across the BJT. It is noted that the temperature swing is relatively small because there are more wirebonds within a given area to function as a heat sink. This creates small swings in temperature across the BJT, and relatively low peak temperatures at various regions of the BJT. This has the beneficial effect of increasing or prolonging the life of the BJT.

Additionally, because of the large number of wirebonds, the load or VSWR distribution across the BJT is also substantially more uniform. For example, the second graph illustrates the swing in the VSWR across the BJT. It is noted that the VSWR swing is relatively small because the large number of wirebonds distributes the load better across the BJT. This creates small swings in VSWR across the BJT, and relatively low peak VSWR at various regions of the BJT. This has the beneficial effect of improving the load mismatch tolerance (LMT) of the RF/microwave circuit 250.

Figure 5A:
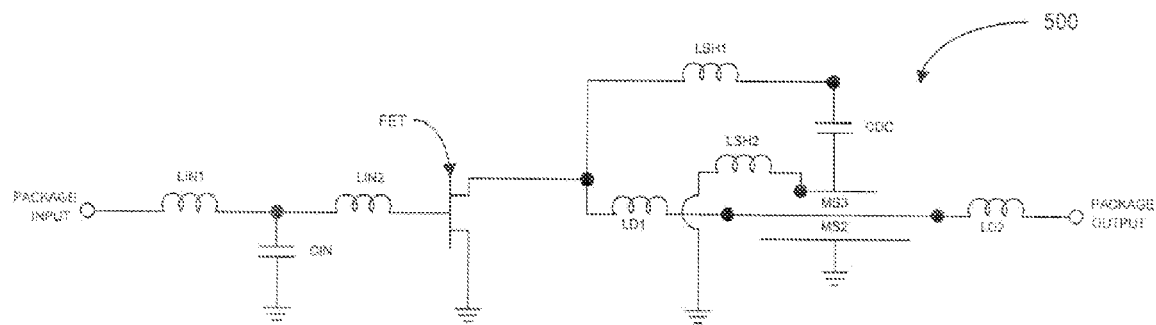
FIG. 5A illustrates a schematic diagram of another exemplary RF/microwave circuit in accordance with another embodiment of the invention.

FIG. 5A illustrates a schematic diagram of another exemplary RF/microwave circuit 500 in accordance with another embodiment of the invention. Similar to the prior embodiment, the output of the RF/microwave circuit 500 is configured to eliminate the physical constraint that requires a sacrifice of one output series inductor wirebond for each added shunt inductor wirebond. As a consequence, more output shunt and series inductor wirebonds may be provided which results in improved power efficiency, higher gain, and greater bandwidth, among other benefits. In this particular embodiment, one terminal, and specifically, the backside of the transistor is disposed directly on a ground plane.

More specifically, the RF/microwave circuit 500 comprises an input impedance matching network including a first input inductor LIN1, an input capacitor CIN, and a second input inductor LIN2. The first input inductor LIN1 includes a first end adapted to receive an input RF/microwave signal, and may be as the input of a module package of the RF/microwave circuit 500. The first input inductor LIN1 includes a second end electrically coupled to an end of the input capacitor CIN and an end of the second input inductor LIN2. The other end of the input capacitor CIN is electrically coupled to ground. The other end of the second input inductor LIN2 is electrically coupled to the gate of a field effect transistor (FET). The FET may be configured as a silicon LDMOS, GaN, GaAs or other type of FET. The FET includes a source which is electrically coupled to ground, and may form the backside of the FET package. The FET includes a drain electrically coupled to an output impedance matching network.

The output impedance matching network comprises a first series output inductor LD1, a second series output inductor LD2, a first shunt output inductor LSH1, a second shunt output inductor LSH2, a DC blocking capacitor CDC, and a multi-layer substrate MS2/MS3. The first series output inductor LD1 includes a first end electrically coupled to the drain of the FET, and a second end electrically coupled to an intermediate metallization layer of the multi-layer substrate MS2/MS3. The second series output inductor LD2 includes a first end coupled to the intermediate metallization layer of the multi-layer substrate MS2/MS3, and a second end that may serve as the output of the RF/microwave circuit 500, as well as the output of the module package of the RF/microwave circuit 500.

The first shunt output inductor LSH1 includes a first end electrically coupled to the drain of the FET, and a second end electrically coupled to a first end of the DC blocking capacitor CDC. The DC block capacitor CDC, in turn, includes a second end electrically coupled to an upper metallization layer of the multi-layer substrate MS2/MS3. The multi-layer substrate MS2/MS3, in turn, includes a lower metallization layer electrically coupled to ground. The second shunt inductor LSH2 includes a first end electrically coupled to the upper metallization layer of the multi-layer substrate MS2/MS3, and a second end electrically coupled to ground. The following describes one example of a particular implementation of the RF/microwave circuit 500.

Figure 5B:
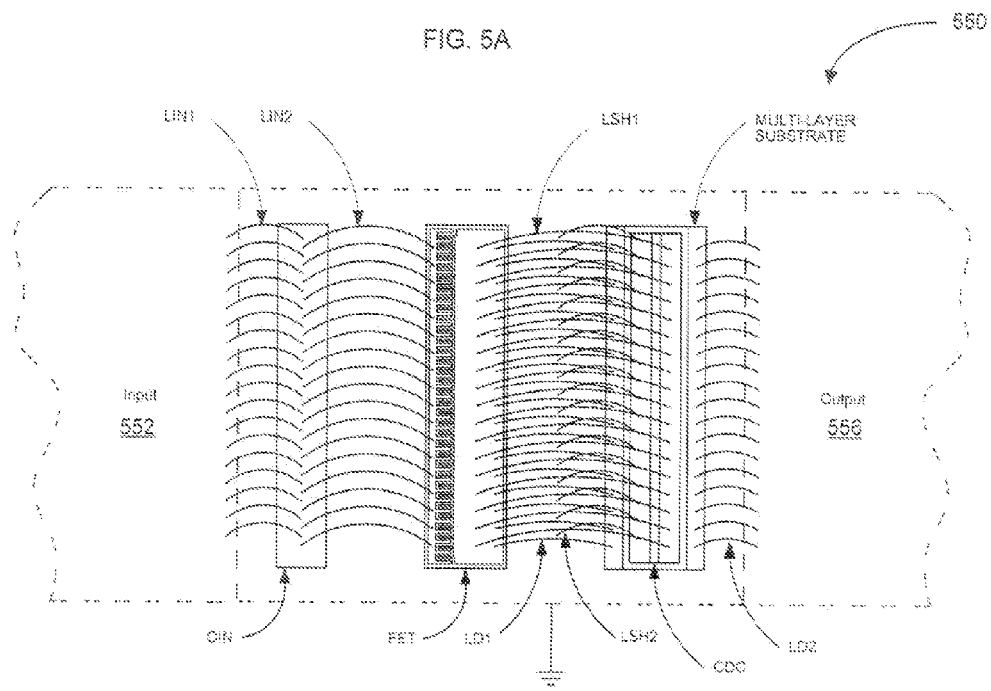
FIGS. 5B-5C illustrate top and side views of one exemplary implementation of the exemplary RF/microwave circuit of FIG. 5A in accordance with another embodiment of the invention.
Figure 5C:
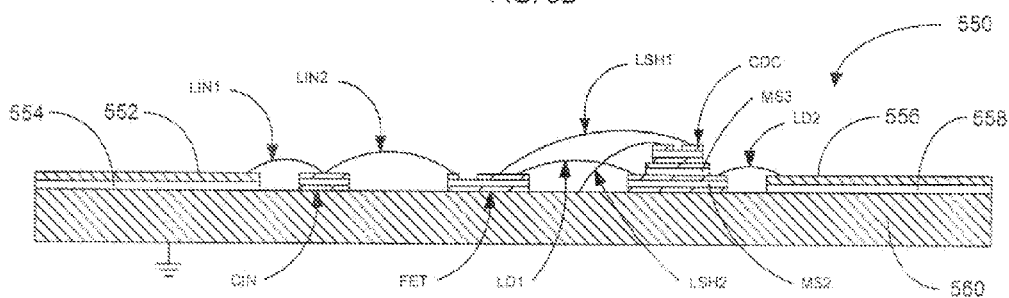

FIGS. 5B-5C illustrate top and side views of one exemplary implementation 550 of the exemplary RF/microwave circuit of FIG. 6A in accordance with another embodiment of the invention. The input of the RF/microwave circuit 500 may be configured as an upper metallization layer 552 of a substrate 554 disposed on a grounded metallization base plate 560. The input capacitor CIN may be configured as a chip capacitor having a lower metallization layer disposed on the grounded metallization base plate 560. The first input inductor LIN1 may be configured as a plurality of parallel wirebonds extending from the input metallization layer 552 to an upper metallization layer of the input capacitor CIN. The FET may be configured as having a bottom source metallization layer disposed on the grounded metallization base plate 560, and upper metallization layers constituting the gate and drain of the device. The second input inductor may be configured as a plurality of parallel wirebonds extending from the upper metallization layer of the input capacitor CIN to the gate of the FET.

The multi-layer substrate MS2/MS3 may be configured to include a lower metallization layer disposed on the grounded metallization base plate 560, an intermediate metallization layer separated from its lower metallization layer by a dielectric substrate MS2, and an upper metallization layer separated from its intermediate metallization layer by another dielectric substrate MS3. The DC blocking capacitor CDC may be configured as a chip capacitor having a bottom metallization layer disposed on the upper metallization layer of the multi-layer substrate MS2/MS3, and a pair of upper metallization layers which serve as both ends of the DC blocking capacitor. An output metallization layer 556 may be disposed on a substrate 558 which, in turn, is disposed on the grounded metallization base plate 560.

The first shunt output inductor LSH1 may be configured as a plurality of parallel wirebonds extending from the drain of the FET to one of the upper metallization layer of the DC blocking capacitor CDC. The second shunt output inductor LSH2 may be configured as a plurality of parallel wirebonds extending from the other upper metallization layer of the DC blocking capacitor to the grounded metallization base plate 560. The first series output inductor LD1 may be configured as a plurality of parallel wirebonds extending from the drain of the FET to the intermediate metallization layer of the multi-layer substrate MS2/MS3. The second series output inductor LD2 may be configured as a plurality of parallel wirebonds extending from the intermediate metallization layer of the multi-layer substrate MS2/MS3 to the output metallization layer 556.

While the invention has been described in connection with various embodiments, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

What is claimed is:

1. An RF/microwave circuit, comprising:
   an input matching network;
   an active device coupled to the input matching network; and
   an output matching network coupled to the active device, wherein the output matching network comprises:
      a multi-level substrate including a first-level metallization layer and a second metallization layer, wherein the first-level metallization layer is situated on a bottom surface of a substrate, and the second metallization layer is situated on a top surface of the substrate;
      a first set of parallel wirebonds electrically connecting a first terminal of the active device to the first-level metallization layer; and
      a second set of parallel wirebonds electrically connecting the first terminal of the active device to a first device disposed on the second-level metallization layer; wherein the output matching network further comprises:
      a dielectric substrate;
      a first metallization pad disposed on the dielectric substrate, wherein the active device is disposed on the first metallization pad, wherein the first terminal of the active device is electrically coupled to the first metallization pad, and wherein the first and second sets of parallel wirebonds electrically attach to the first metallization pad;
      a second metallization pad disposed on the dielectric substrate, wherein the second metallization pad is electrically connected to ground potential, and wherein the multi-level substrate is disposed on the second metallization pad;
      a third metallization pad disposed on the dielectric substrate, wherein the third metallization pad is adapted to output an output RF/microwave signal;
      a third set of parallel wirebonds electrically connecting the second metallization pad to a second terminal of the active device;
      a fourth set of parallel wirebonds electrically connecting the second-level metallization layer of the multi-level substrate to the second metallization pad; and
      a fifth set of parallel wirebonds electrically connecting the first-level metallization layer of the multi-level substrate to the third metallization pad.

2. The RF/microwave circuit of claim 1, wherein the first device includes a first capacitor having first and second terminals, wherein the first terminal of the first capacitor is electrically coupled to the second-level metallization layer of the multi-layer substrate, and wherein the second set of parallel wirebonds is electrically connected to the second terminal of the first capacitor.

3. The RF/microwave circuit of claim 2, wherein the input matching circuit comprises:
   a fourth metallization pad disposed on the dielectric substrate, wherein the fourth metallization pad is adapted to receive an input RF/microwave signal;
   a fifth metallization pad disposed on the dielectric substrate, wherein the fifth metallization pad is electrically connected to ground potential;

a second capacitor disposed on the fifth metallization pad, wherein the second capacitor includes a first terminal electrically connected to the fifth metallization pad, and a second terminal;

a sixth set of parallel wirebonds electrically connecting the fourth metallization pad to the second terminal of the second capacitor;

a seventh set of parallel wirebonds electrically connecting the second terminal of the second capacitor to a third terminal of the active device; and an eighth set of parallel wirebonds electrically connecting the first terminal of the second capacitor to the second terminal of the active device.

4. The RF/microwave circuit of claim 3, wherein the active device comprises a bipolar junction transistor (BJT), and wherein the first, second, and third terminals of the BJT respectively include the collector, base, and emitter of the BJT.

* * * * *